United States Patent [19]
Chien

[11] Patent Number: 6,001,682
[45] Date of Patent: Dec. 14, 1999

[54] METHOD OF FABRICATING CYLINDER CAPACITORS

[75] Inventor: Sun-Chieh Chien, Hsinchu, Taiwan

[73] Assignee: United Microelectronics Corp., Taipei, Taiwan

[21] Appl. No.: 09/059,319

[22] Filed: Apr. 13, 1998

[30]     Foreign Application Priority Data

Feb. 6, 1998 [TW]  Taiwan ................................. 87101562

[51] Int. Cl.⁶ ........................ H01L 21/8242; H01L 21/20
[52] U.S. Cl. ..................... 438/239; 438/253; 438/254; 438/381; 438/397
[58] Field of Search ..................... 438/239, 253, 438/254, 381, 397, 256, 399, 171, 190, 210, 666

[56]           References Cited

U.S. PATENT DOCUMENTS

| | | | |
|---|---|---|---|
| 5,438,013 | 8/1995 | Kim et al. | 437/60 |
| 5,733,808 | 3/1998 | Tseng | 438/239 |
| 5,861,331 | 1/1999 | Chien | 438/238 |
| 5,902,126 | 5/1999 | Hong et al. | 438/396 |
| 5,930,621 | 7/1999 | Kang et al. | 438/253 |

*Primary Examiner*—John F. Niebling
*Assistant Examiner*—Neal Berezny
*Attorney, Agent, or Firm*—Thomas, Kayden, Horstemeyer & Risley

[57]           ABSTRACT

A method of fabricating cylinder capacitors is provided comprising forming a first conductive layer and a dielectric layer on the semiconductor substrate. A via is formed in the dielectric layer. Then, a second conductive layer and a top oxide layer are formed on the dielectric layer. Part of the top oxide layer and the second conductive layer is removed by pattering the photoresist layer. A first spacer is formed at a side wall of the top oxide layer and the second conductive layer. The second conductive layer is etched by using the top oxide layer and the first spacer as a mask. Then, the top oxide layer is removed to form a second spacer. The second spacer is used as a mask in etching the second conductive layer to form a cup-shaped lower electrode. Further, a dielectric film layer and an upper electrode are formed to make a cylinder capacitor.

12 Claims, 9 Drawing Sheets

METHOD OF FABRICATING CYLINDER CAPACITORS

CROSS-REFERENCE TO RELATED APPLICATION

This application claims the priority benefit of Taiwan application Ser. No. 87101562, filed Feb. 6, 1998, the full disclosure of which is incorporated herein by reference.

BACKGROUND OF THE INVENTION

1. Field of the Invention

The invention relates in general to a method for manufacturing dynamic random access memory (DRAM). More particularly, the invention relates to the manufacturing of a DRAM capacitor that has a larger electrode surface area for increasing the memory storage capacity of a DRAM.

2. Description of the Related Art

As microprocessors become more powerful and the amount of software data that needs to be processed becomes very large, the amount of memory necessary for storing data becomes great. FIG. 1 is a circuit diagram showing a DRAM memory unit. A DRAM memory unit comprises a pass transistor 10 and a storage capacitor 11. The source terminal of the pass transistor 10 is connected to a bit line 12, the gate terminal is connected to a word line 13, and the drain terminal is connected to the storage electrode, known also as the lower electrode 14, of a storage capacitor 11. The plate electrode 15, also known as an upper electrode or a cell plate, is connected to a fixed voltage source. Between the storage electrode 14 and the plate electrode is a dielectric thin film 16.

When a small charge storage capacity is needed in a DRAM capacitor, a conventional two-dimensional or a planar type of capacitor can be fabricated in the integrated circuit. However, a planar type capacitor occupies a rather large surface area on the semiconductor substrate surface, hence is not suitable for high levels of integration. Therefore, three-dimensional capacitors, for example, the so-called stacked type or trench type capacitors, are used for increasing the level of integration of DRAMs. Nowadays, even the simple three-dimensional capacitor design is insufficient to provide the necessary capacitance. Consequently, methods of producing DRAM capacitors that can increase the surface area of the lower electrode within a given substrate area are still being developed.

FIG. 2 is a cross-sectional view of a conventional stacked type DRAM capacitor structure. First, a semiconductor substrate 20 having a metallic oxide semiconductor (MOS) transistor 22 already formed thereon is provided. The MOS transistor includes a gate terminal 23, source/drain region 24 and spacers 25. On top of the substrate 20, there is a field oxide layer 26 and a conductive layer 27. Next, insulating material is deposited over the substrate to form an insulating layer 28, and then the insulating layer 28 is etched to form contact windows at designated locations above the source/drain regions 24. Thereafter, a lower electrode 29, a dielectric layer 210 and an upper electrode 211 are sequentially formed above the contact windows to form a stacked capacitor structure 212. The dielectric layer 210 can be a silicon nitride/silicon dioxide (NO) composite layer or a silicon dioxide/silicon nitride/silicon dioxide (ONO) composite layer. The lower electrode 29 and the upper electrode 211 can be polysilicon layers. Furthermore, the lower electrode 29 can have an undulating and non-planar profile. Finally, subsequent processing operations such as the formation of a metallic contact and protective insulating layer are performed to complete the DRAM capacitor structure.

FIG. 3A–3F are cross-sectional views showing the progression of manufacturing steps in the fabrication of a cylinder DRAM capacitor according to a conventional method. First, referring to FIG. 3A, a first oxide layer 304 is formed on a MOS device 300, with a source/drain region 301, a field oxide layer 302 and gate electrode 303 provided on the MOS device 300. A thin silicon nitride layer 305 is formed on a surface of the first oxide layer 304 to be an etching stop layer in follow-up steps.

Referring to FIG. 3B, a photolithography step is promoted to pattern the silicon nitride layer 305 and the first oxide layer 304 to form a first contact opening 306 and expose the source/drain region 301 on the MOS device 300. Further, a first polysilicon layer 307 is deposited on the silicon nitride layer 305 and fills the first contact opening 306. The first polysilicon layer 307 is etched back until a surface of the first polysilicon layer 307 is flush with the surface of the silicon nitride layer 305 showed in FIG. 3C.

Referring to FIG. 3D, a second oxide layer 308 is formed, for example, by chemical vapor deposition (CVD) on the structure showed in FIG. 3C. The second oxide layer 308 is patterned by a photolithography step to formed a second opening 309 and to expose the contact opening 306. Then, a second polysilicon layer 310 is formed on the surface of the MOS device to cover the second oxide layer 308 and fill the second opening 309. The second polysilicon layer 310 is coupled with the first polysilicon layer 307. Further, a third oxide layer 311 is formed on the second polysilicon layer 310.

Referring to FIG. 3E, the third oxide layer 311 is etched back to expose the surface of the second polysilicon layer 310. Then, the second polysilicon layer 310 is etched back until the second oxide layer 308 is exposed.

Finally, referring to FIG. 3F, the third oxide layer 311 and the second oxide layer 308 remaining on the MOS device are removed by wet etching, in which the silicon nitride layer 305 is used as an etching stop layer. A dielectric film layer 312 is formed on the top surface of the MOS device, and a third polysilicon layer 313 is formed on the dielectric thin layer 312 to make the DRAM cylinder capacitor structure.

Cylinder capacitors are conventional capacitor structures used currently in DRAMs. The polysilicon layer is etched back to form a spacer used as a hard mask. A dummy oxide layer is dug, and a silicon nitride layer is used for a etching stop layer during the digging step. The cylinder structure increases the surface area of the capacitor to enhance the capacitance, but a disadvantage of the structure is the high stress of the silicon nitride layer. The high stress makes the cylinder structure crack in the back-ending process. Furthermore, many steps are needed to form the cylinder structure and the process is complex.

SUMMARY OF THE INVENTION

It is therefore the object of the invention to provide a method of fabricating cylinder capacitors. A top cap oxide layer is used as a hard mask for etching polysilicon layers. The etching margin is improved by increasing the time for etching polysilicon layers.

The invention achieves the above-identified object by providing a method of fabricating cylinder capacitors. First, a first conductive layer is formed and patterned on a semiconductor substrate. Then, a dielectric layer is formed on the first conductive layer and the semiconductor substrate, and a via is formed in the dielectric layer to partially expose the semiconductor substrate. A second conductive layer and a top oxide layer are formed in sequence on the dielectric layer. The second conductive layer in coupled with the semiconductor substrate through the via. Part of the top oxide layer and the second conductive layer are removed by using a patterned photoresist. An oxide layer is formed on the structure etched in the forgoing step and is etched back to form a first spacer at the side wall of the top oxide layer and the side wall of the second conductive layer. The first spacer and the top oxide layer are used as a mask to remove partially the second conductive layer. Then, the top oxide layer is removed. A second spacer remaining after removal of the top oxide is used as a mask to etch the second conductive layer. The forgoing step forms a cup-shaped structure to be a lower electrode of a capacitor. A dielectric thin layer and an upper electrode are formed in sequence to complete the manufacture of cylinder capacitors.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1:
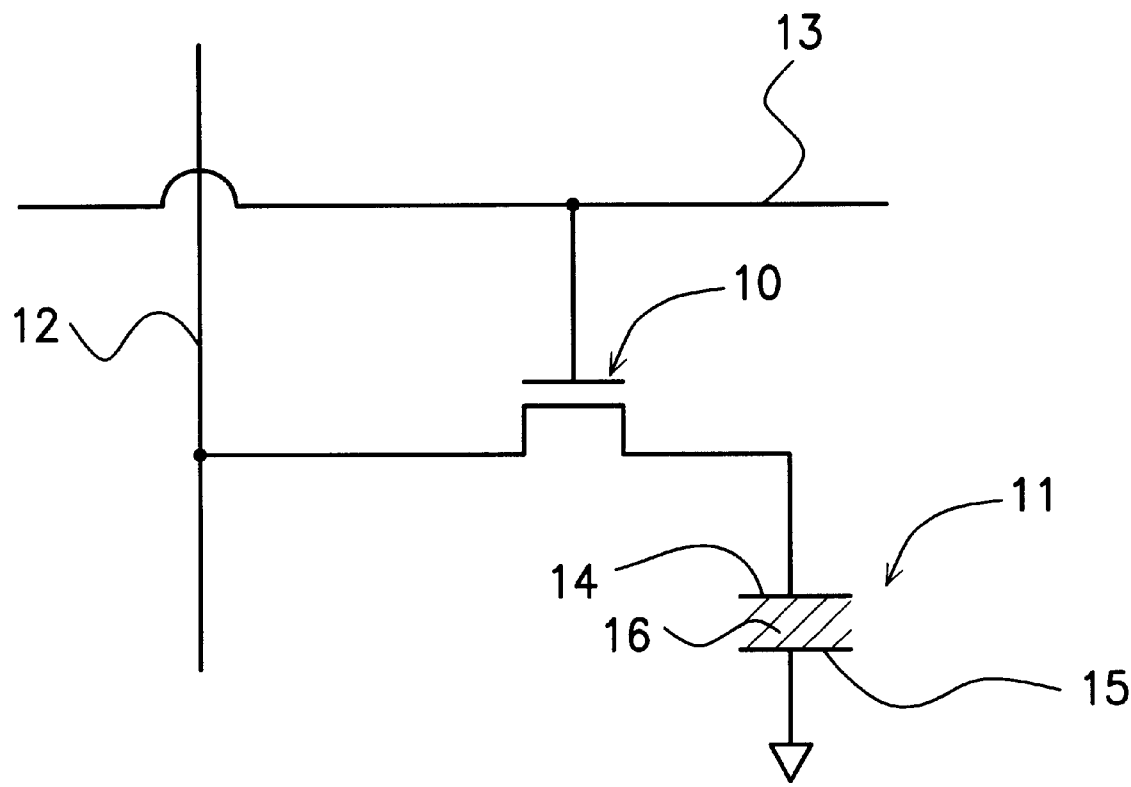
FIG. 1 is a circuit diagram showing a DRAM memory unit.
Figure 2:
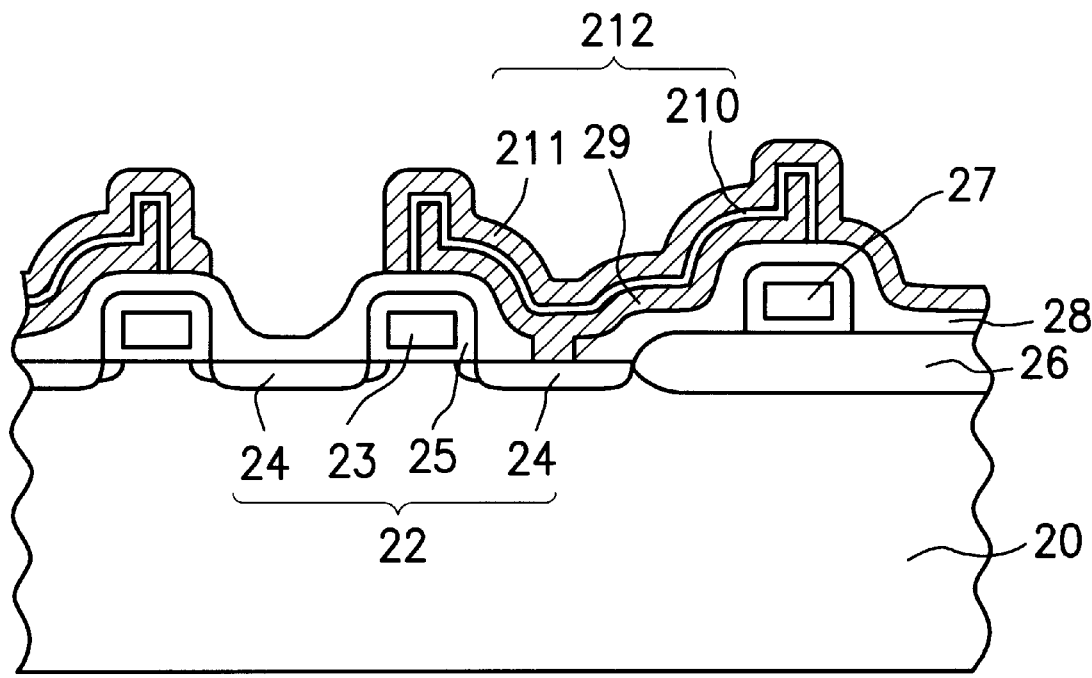
FIG. 2 is a cross-sectional view of a conventional stacked-type DRAM capacitor structure.
Figure 3A:
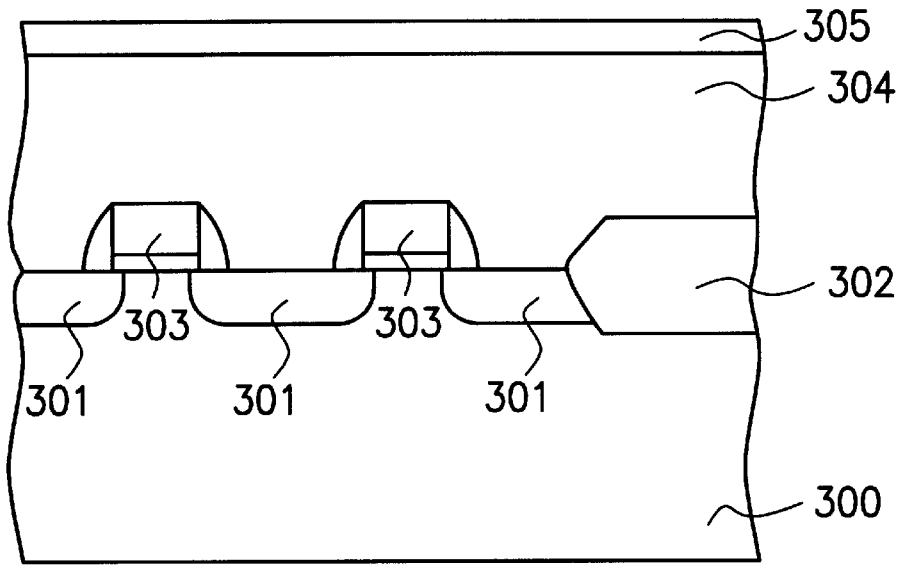
FIGS. 3A–3D are cross-sectional views showing the process steps in the fabrication of a cylinder capacitor according to a conventional method.
Figure 3B:
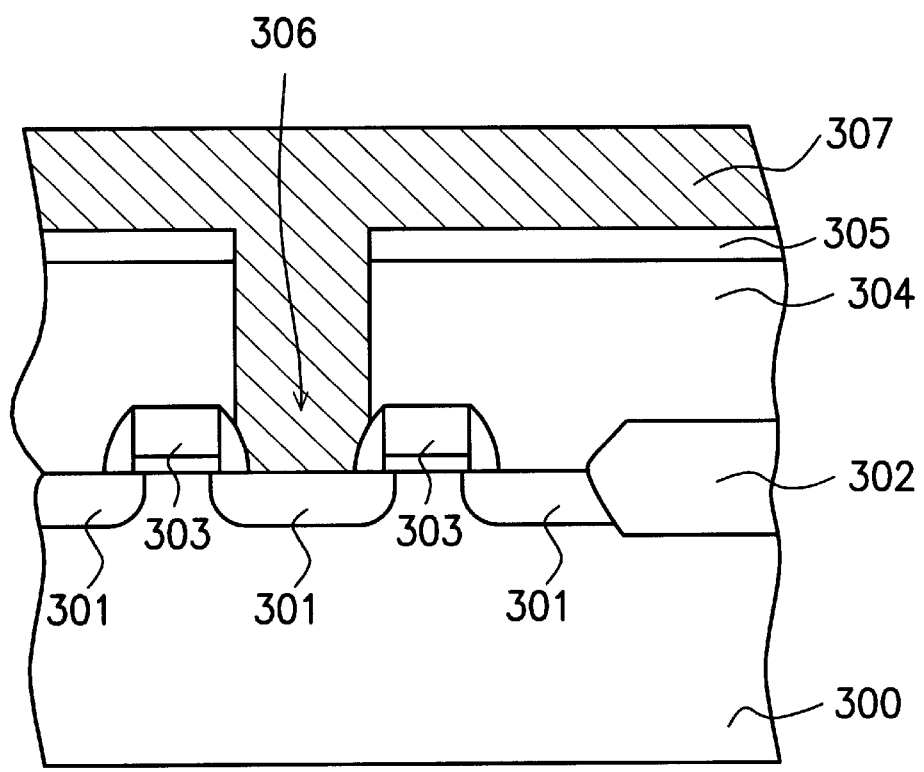
Figure 3C:
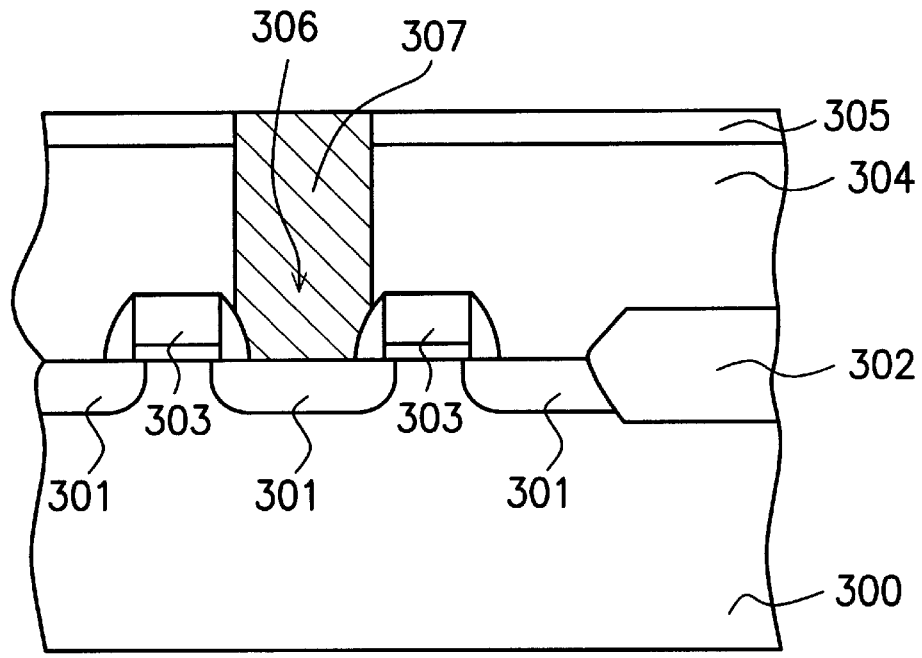
Figure 3D:
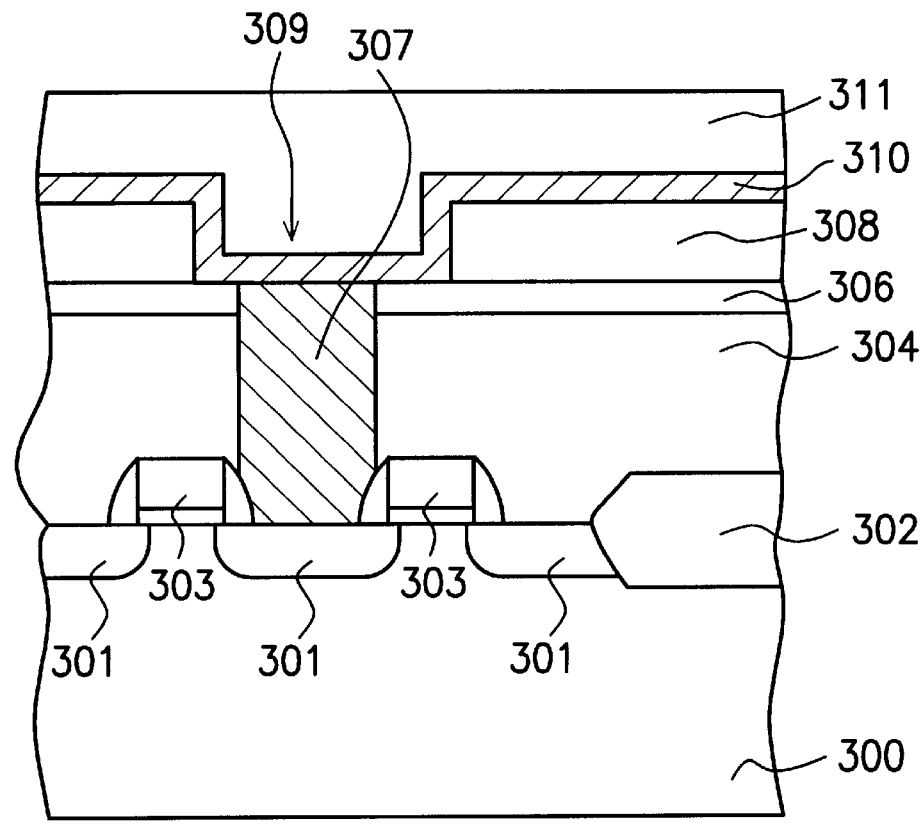
Figure 3E:
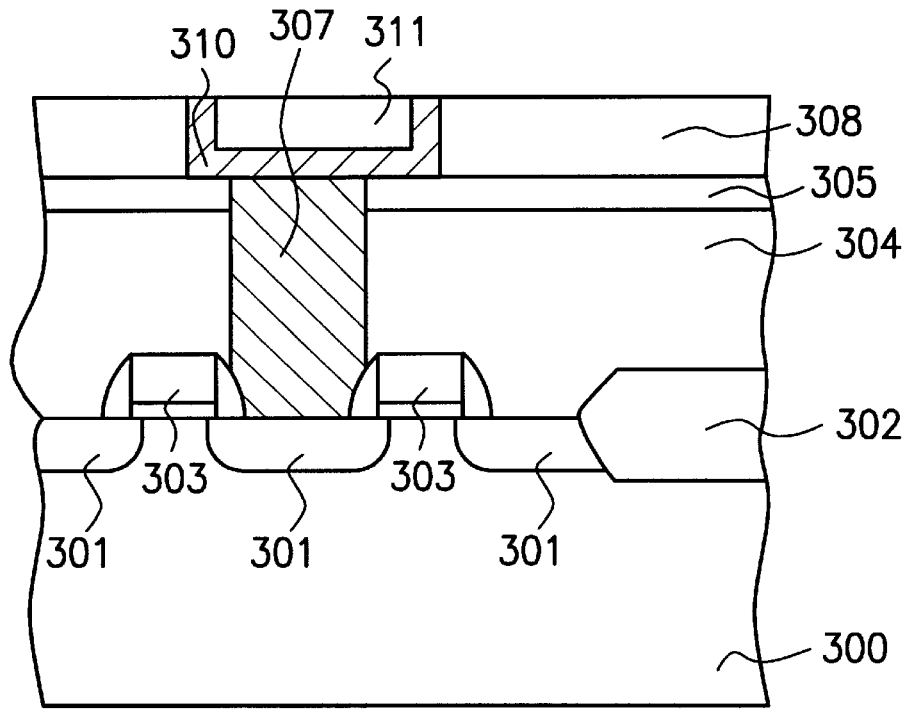
Figure 3F:
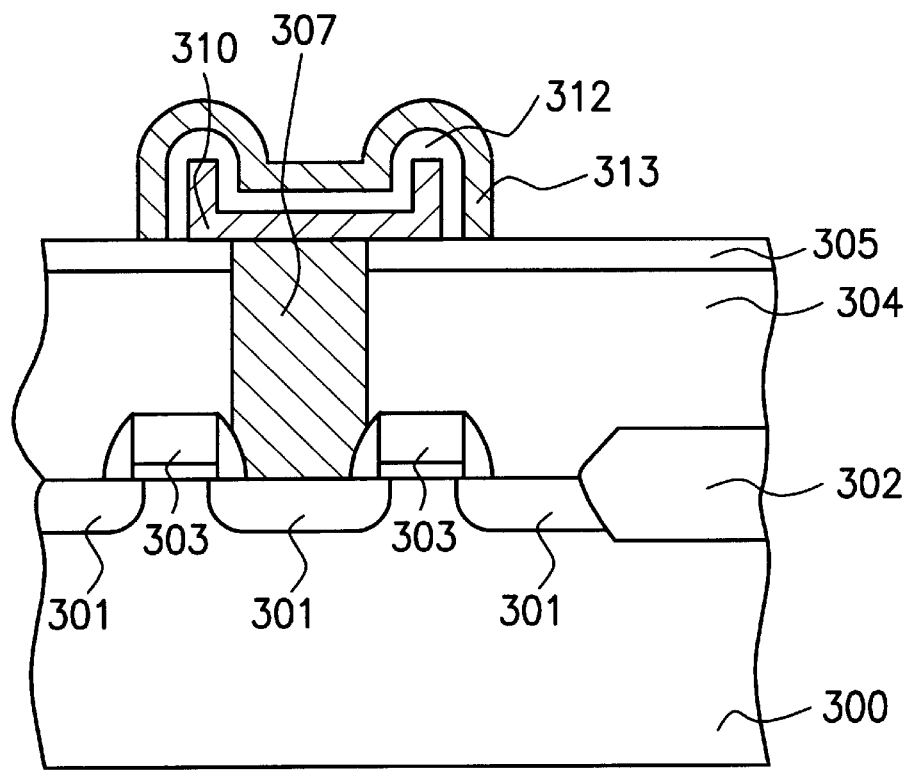
Figure 4A:
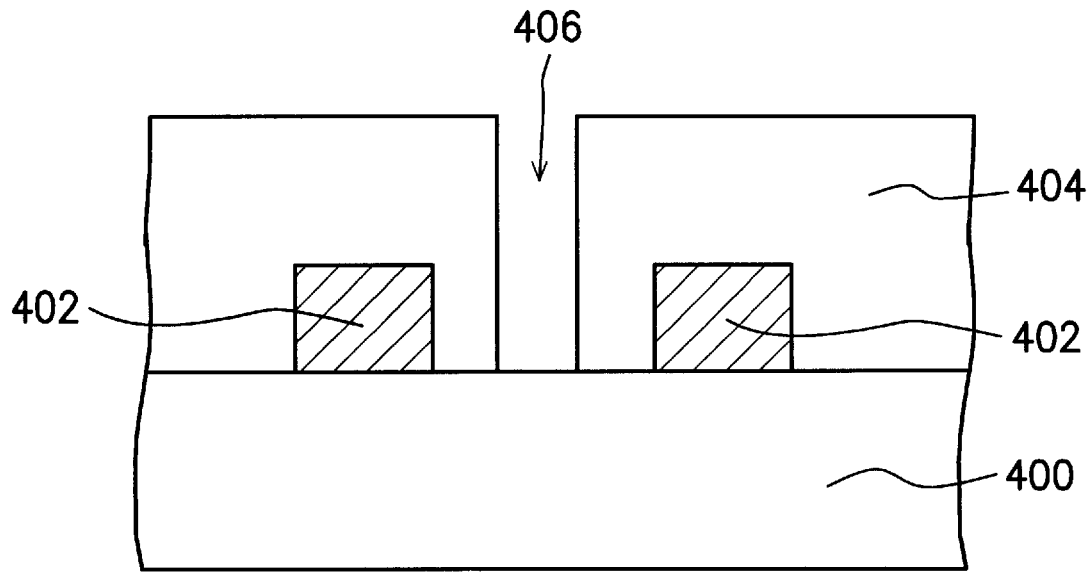
FIGS. 4A–4H are cross-sectional views showing the process steps of one preferred embodiment of the method for fabricating a cylinder capacitor.

Referring first to FIG. 4A, a semiconductor substrate 400 is provided. A first conductive layer 402 is formed and patterned on the semiconductor substrate 400. The material of the first conductive layer 402 is, for example, polysilicon formed by chemical vapor deposition (CVD). A dielectric layer 404 is formed on the semiconductor substrate 400 and the first conductive layer 402. The material of the dielectric layer 404 is, for example, oxide. A contact 406 is formed to expose the semiconductor substrate 400 by patterning and partially removing the dielectric layer.

Figure 4B:
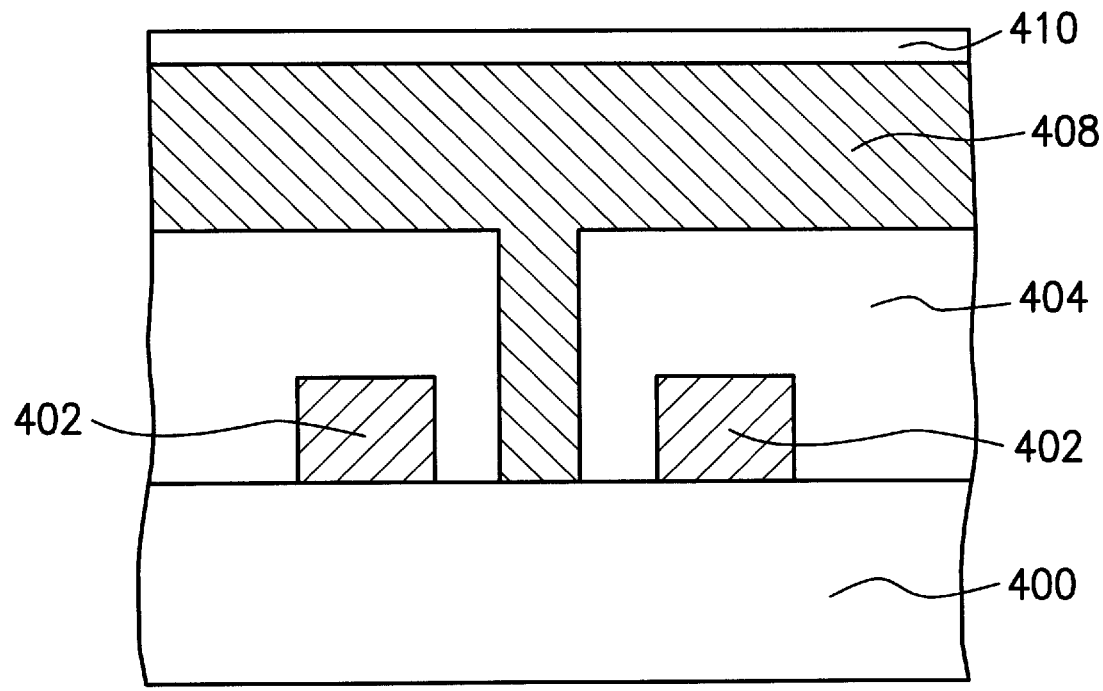

Referring to FIG. 4B, a second conductive layer 408 is formed on the dielectric layer 404 and coupled with the semiconductor substrate 400 through the contact 406. The material of the second conductive layer 408 is, for example, polysilicon formed by CVD and has a thickness of about 5000–10000 Å. Then, a top oxide layer 410 is formed on the second conductive layer 408 with a thickness of about 500–2000 Å.

Figure 4C:
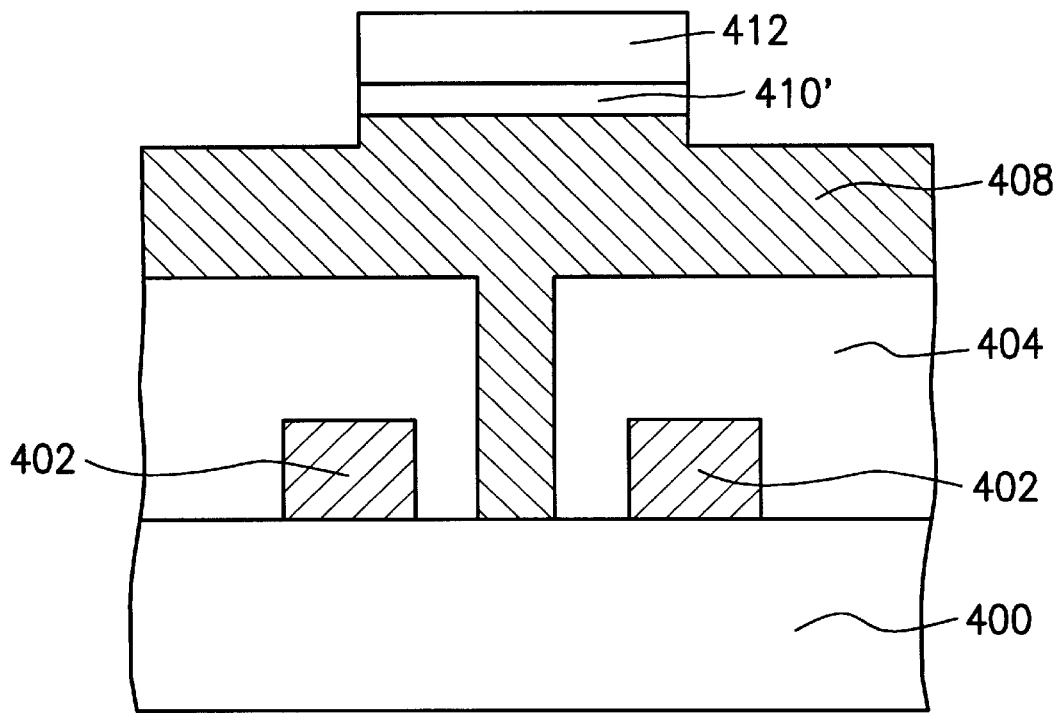

Referring to FIG. 4C, a photoresist layer 412 is formed and patterned on the top oxide layer 410. The top oxide layer 410 and the second conductive layer 408 are, for example, removed partially by etching according to the photoresist layer 412 patterned in the forgoing step. Part of the top oxide layer 410 and part of the second conductive layer 408 covered by the photoresist layer 412 remain. Part of the top oxide layer 410 uncovered is removed completely, and part of the uncovered second conductive layer 408 is removed. The thickness of part of the second conductive layer 408 etched in the forgoing step is about 1000–2000 Å.

Figure 4D:
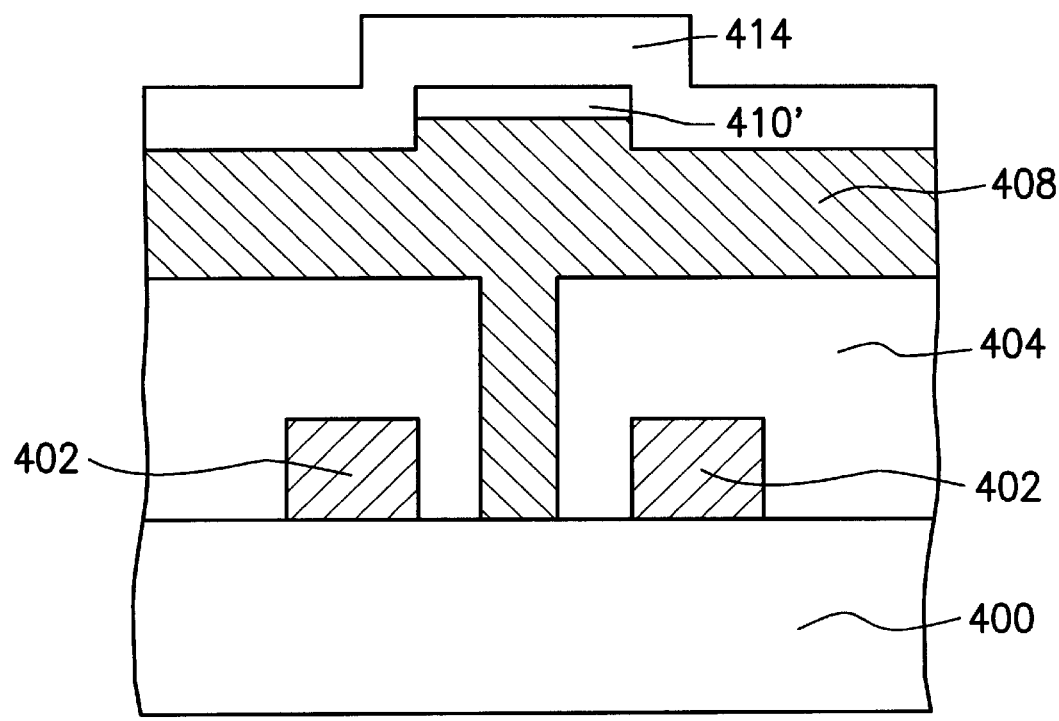

Referring to FIG. 4D, the photoresist layer 412 is removed. Then, an oxide layer 414 is formed, for example, by CVD on the etched top oxide layer 410' and the second conductive layer 408. The oxide layer 414 has a thickness of about 1000–2000 Å.

Figure 4E:
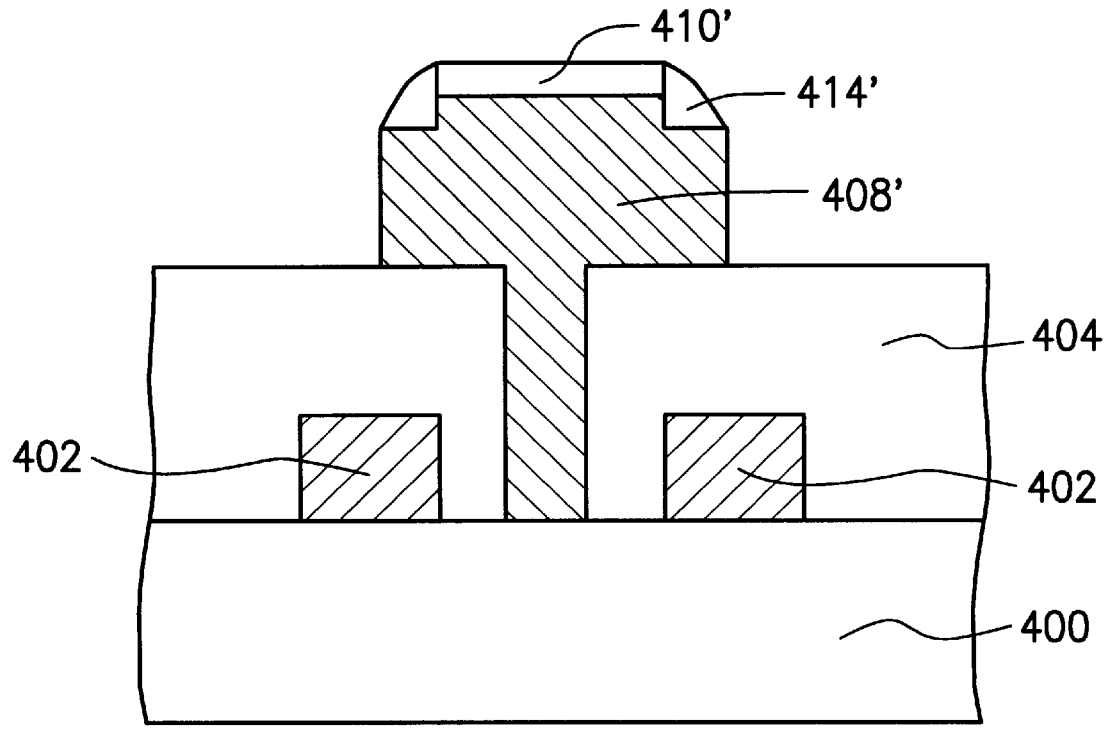

Referring to FIG. 4E, part of the oxide layer 414 is removed to form a first spacer 414' at a side wall of the top oxide layer 410' and the second conductive layer 408. The first spacer 414' is formed by etch back. Then, the first spacer 414' is used as a mask to remove parts of the second conductive layer 408 uncovered by the first spacer 414' and to expose the dielectric layer 404. Another part of the second conductive layer 408 under the top oxide layer 410' and the first spacer 414' remains in the forgoing step.

Figure 4F:
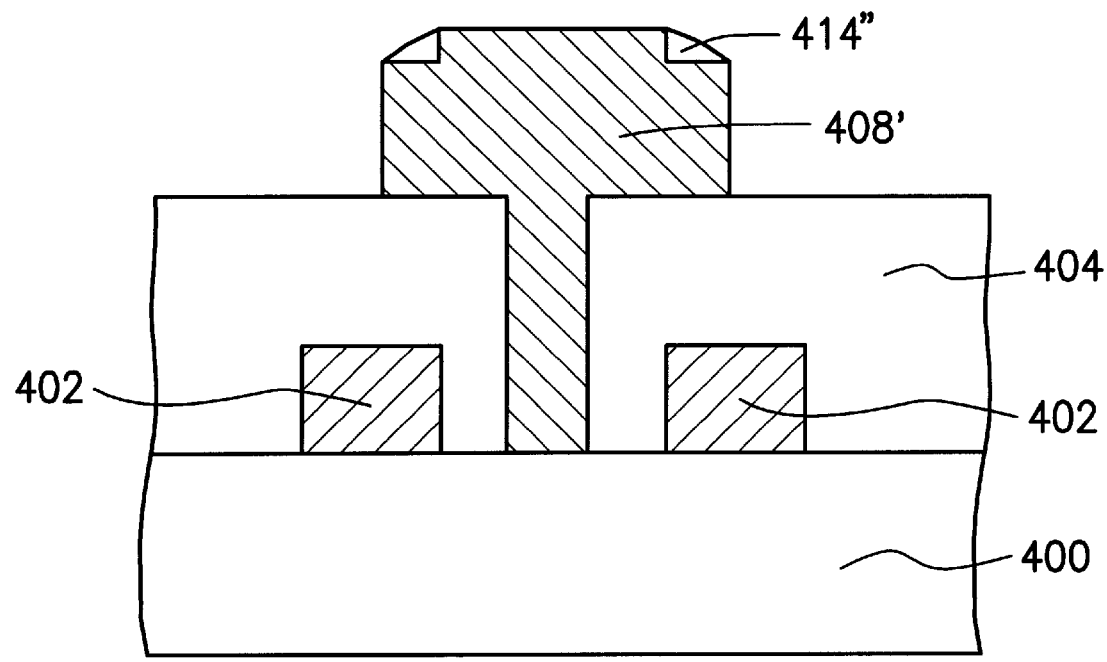

Referring to FIG. 4F, the top oxide layer 410' is removed, for example, by etching. Since the material of the first spacer 414' and the material of the top oxide layer 410' are the same, the first spacer 414' is etched concurrently in the forgoing step to form a smaller second spacer 414" showed in the FIG. 4F.

Figure 4G:
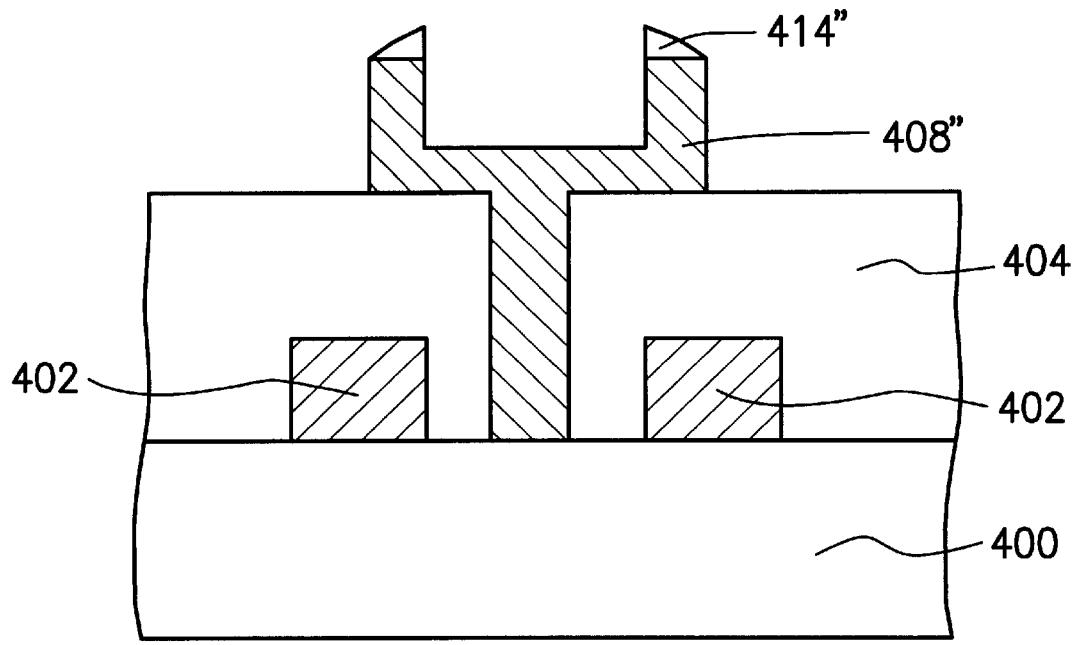

Referring to FIG. 4G, the second conductive layer 408' is partially removed using the second spacer 414" as a mask. The etching time is controlled to leave the second conductive layer 408' with a thickness of about 500–2000 Å to form a cup-shaped structure. The cup-shaped structure is used as a lower electrode 408" of the capacitor.

Figure 4H:
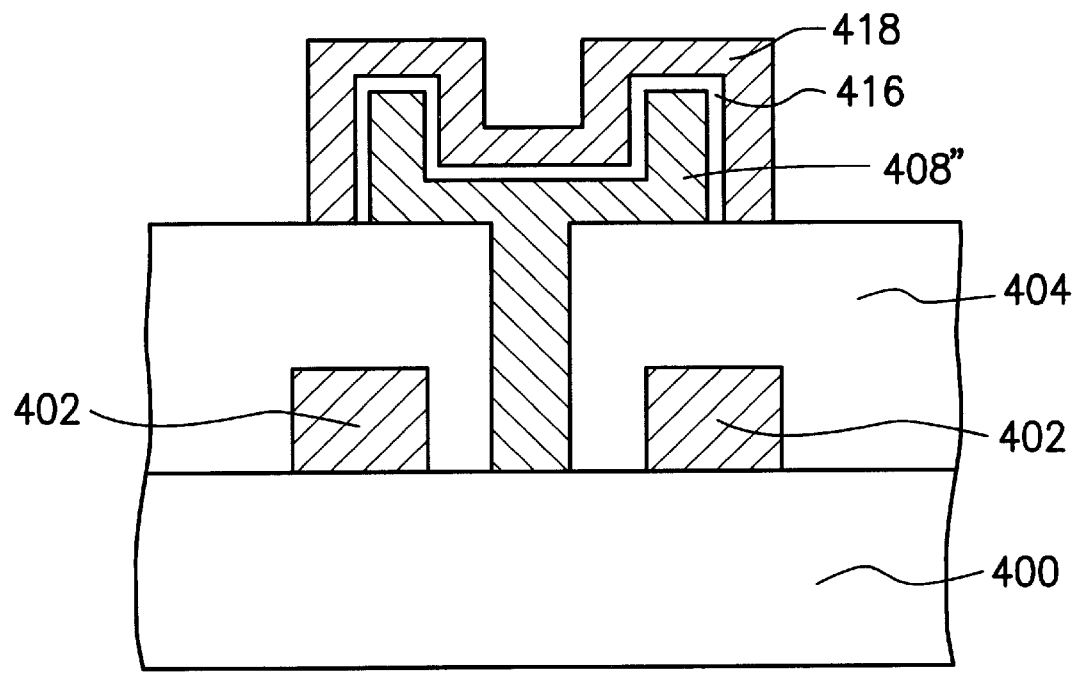

Referring to FIG. 4H, the second spacer 414" is, for example, removed by wet etching or dry etching. A dielectric film layer 416 is formed on the lower electrode 408". The dielectric film layer 416 is composed of silicon nitride/silicon oxide (NO) or silicon dioxide/silicon nitride/silicon dioxide (ONO) with a thickness of about 300–1000 Å. Silicon nitride is formed, for example, by CVD and silicon dioxide is formed, for example, by oxidation. Then, a third conductive layer 418 is formed on the dielectric film layer 416 to be a upper electrode.

This invention provides a method using the top oxide layer as a hard mask during etching polysilicon layers. The method doesn't have the structural disadvantages of the conventional method described above. The top oxide layer used in this invention can increase the over-etching time and improves the etching margin.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of fabricating cylinder capacitors, comprising the steps of:

providing a semiconductor substrate, wherein the semiconductor substrate at least comprises a first conductive layer and a dielectric layer having a via over the semiconductor substrate and the first conductive layer;

forming a second conductive layer coupling with the semiconductor substrate through the via on the dielectric layer;

forming a top oxide layer on the second conductive layer;

partially removing the top oxide layer and the second conductive layer;

forming a first spacer at a side wall of the top oxide layer and the second conductive layer;

removing the second conductive layer uncovered by the top oxide layer and the first spacer to expose part of the dielectric layer;

removing the top oxide layer and part of the first spacer to expose the second conductive layer and to form a second spacer;

removing the second conductive layer uncovered by the second spacer to form a cup-shaped lower electrode;

forming a dielectric film layer on the cup-shaped lower electrode; and forming a upper electrode on the dielectric film layer.

2. A method according to claim 1, wherein the first conductive layer is a polysilicon layer.

3. A method according to claim 1, wherein the dielectric layer is an oxide layer.

4. A method according to claim 1, wherein forming the via comprises the steps of:

forming a dielectric layer on the semiconductor substrate and the first conductive layer; and partially removing the dielectric layer to form the via and expose a surface of the semiconductor substrate.

5. A method according to claim 1, wherein the second conductive layer is a polysilicon layer.

6. A method according to claim 1, wherein forming the first spacer comprises the steps of:

forming a oxide layer on the top oxide layer and the second conductive layer; and partially removing the oxide layer to form the first spacer.

7. A method according to claim 6, wherein the step of partially removing the oxide layer to form the first spacer is done by etching back.

8. A method of fabricating cylinder capacitors, the method comprising the steps of:

providing a semiconductor substrate;

forming a first conductive layer on the semiconductor substrate;

forming a dielectric layer on the first conductive layer;

partially removing the dielectric layer to form a via to expose part of the semiconductor substrate;

forming a second conductive layer on the dielectric layer, wherein the second conductive layer couples with the semiconductor substrate through the via;

forming a top oxide layer on the second conductive layer;

partially removing the top oxide layer and the second conductive layer;

forming a oxide layer on the top oxide layer and the second conductive layer;

partially removing the oxide layer to form a first spacer at a side wall of the top oxide layer and the second conductive layer;

removing the second conductive layer uncovered by the top oxide layer and the first spacer;

removing the top oxide layer and part of the first spacer to expose the second conductive layer and form a second spacer;

removing the second conductive layer uncovered by the second spacer to form a cup-shaped lower electrode;

forming a dielectric film layer on the cup-shaped lower electrode; and forming an upper electrode on the dielectric film layer.

9. A method according to claim 8, wherein the first conductive layer is a polysilicon layer.

10. A method according to claim 8, wherein the dielectric layer is an oxide layer.

11. A method according to claim 8, wherein the second conductive layer is a polysilicon layer.

12. A method according to claim 8, wherein the first spacer is formed by etching back.

* * * * *